(12) United States Patent
Leckelt et al.

(10) Patent No.: US 10,772,239 B2
(45) Date of Patent: Sep. 8, 2020

(54) MANUFACTURED DATA CENTER

(71) Applicant: LEX INDUSTRIES LTD., Edmonton (CA)

(72) Inventors: Lindsey Leckelt, Sherwood Park (CA); Ryan Vetsch, Fort Saskatchewan (CA); Andrew MacNeil, Sherwood Park (CA); Andrew White, Sherwood Park (CA)

(73) Assignee: LEX INDUSTRIES LTD., Edmonton, AB (CA)

(*) Notice: Subject to any disclaimer, the term of this patent is extended or adjusted under 35 U.S.C. 154(b) by 0 days.

(21) Appl. No.: 14/067,981

(22) Filed: Oct. 31, 2013

(65) Prior Publication Data
US 2014/0133092 A1 May 15, 2014

Related U.S. Application Data

(60) Provisional application No. 61/724,347, filed on Nov. 9, 2012.

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01)

(58) Field of Classification Search
CPC ........ H05K 7/20; H05K 7/20745; H05K 7/29; G06F 1/20; F25F 13/00; E04H 2005/005; H02H 9/02; F25D 23/12; B60F 1/00
USPC ................ 361/601–605, 611, 622–627, 637, 361/647–650, 679.01, 679.02, 361/679.33–679.63, 679.46–679.53, 688, 361/689, 700–728, 732, 756; 165/104.33, 165/185, 80.2; 52/34, 79.1, 79.12, 79.5; 454/184, 187; 713/300, 322, 324, 340; 700/299, 300, 277; 714/14, 24
See application file for complete search history.

(56) References Cited

U.S. PATENT DOCUMENTS

| | | | | |
|---|---|---|---|---|
| 4,478,018 A | * | 10/1984 | Holand | .................. E04B 1/762 |
| | | | | 52/220.1 |
| 5,853,810 A | * | 12/1998 | Zhang et al. | .............. 427/407.1 |
| 7,112,131 B2 | * | 9/2006 | Rasmussen et al. | .......... 454/184 |

(Continued)

FOREIGN PATENT DOCUMENTS

| | | | | |
|---|---|---|---|---|
| CN | 202575103 U | * | 12/2012 | ............. B65D 90/02 |
| MY | 126090 A | * | 9/2006 | ............. B65D 73/02 |

OTHER PUBLICATIONS

Portafab Cleanroom Systems Brochure, Fabline Wall Systems, pp. 8-10.

*Primary Examiner* — Courtney L Smith
(74) *Attorney, Agent, or Firm* — Heuschen and Sage

(57) ABSTRACT

A manufactured data center (MDC) uses construction systems and methods allowing the MDC unit to serve as a drop-in replacement for a traditional brick-and-mortar computer data center, while providing functional and operational advantages over known modular data centers. The MDC comprises "white space" housing supported equipment such as servers and other heat-producing computing equipment, plus a power center incorporating electrical equipment and infrastructure necessary for operation of the supported equipment, including an HVAC system which may comprise a purpose-built computer room air conditioning (CRAC) unit.

14 Claims, 4 Drawing Sheets

(56) References Cited

U.S. PATENT DOCUMENTS

| | | | | |
|---|---|---|---|---|
| 7,278,273 B1* | 10/2007 | Whitted | | G06F 1/16 361/690 |
| 7,511,959 B2* | 3/2009 | Belady | | G06F 1/18 165/104.33 |
| 7,861,102 B1* | 12/2010 | Ranganathan et al. | | 713/300 |
| 8,077,457 B2* | 12/2011 | Gauthier | | G06F 1/182 165/104.33 |
| 8,176,342 B2* | 5/2012 | Vaidyanathan et al. | | 713/300 |
| 8,218,322 B2* | 7/2012 | Clidaras et al. | | 361/701 |
| 8,251,785 B2* | 8/2012 | Schmitt | | H05K 7/1497 361/695 |
| 8,264,840 B2* | 9/2012 | Bergthold | | H05K 7/1497 361/690 |
| 8,331,086 B1* | 12/2012 | Meissner | | H05K 7/20736 312/223.2 |
| 8,446,710 B2* | 5/2013 | Schmitt et al. | | 361/624 |
| 8,477,489 B2* | 7/2013 | Lin | | 361/679.46 |
| 8,514,572 B2* | 8/2013 | Rogers | | 361/695 |
| 8,707,095 B2* | 4/2014 | Grimshaw | | 714/14 |
| 8,833,001 B2* | 9/2014 | Gardner | | E04B 1/34384 52/243.1 |
| 8,839,569 B2* | 9/2014 | Crosby, Jr. | | 52/79.8 |
| 8,854,809 B2* | 10/2014 | Neumann | | G06F 1/20 361/679.54 |
| 8,949,646 B1* | 2/2015 | Weber | | G06F 1/3206 713/300 |
| 9,155,229 B2* | 10/2015 | Schmitt | | H05K 7/1497 |
| 9,258,930 B2* | 2/2016 | Gardner | | H05K 7/1497 |
| 9,332,670 B1* | 5/2016 | Eichelberg | | H05K 7/1495 |
| 2006/0082263 A1* | 4/2006 | Rimler | | B60P 3/14 312/201 |
| 2007/0278860 A1* | 12/2007 | Krieger | | H02J 9/061 307/64 |
| 2008/0236070 A1* | 10/2008 | Serinet | | 52/234 |
| 2009/0050591 A1* | 2/2009 | Hart | | G06F 1/182 211/162 |
| 2009/0229194 A1* | 9/2009 | Armillas | | E04H 1/1205 52/79.1 |
| 2009/0271643 A1* | 10/2009 | Vaidyanathan et al. | | 713/320 |
| 2009/0301123 A1* | 12/2009 | Monk | | F24F 11/0001 62/259.2 |
| 2010/0042860 A1* | 2/2010 | Kwon et al. | | 713/340 |
| 2010/0058685 A1* | 3/2010 | Bousseton et al. | | 52/220.1 |
| 2010/0139887 A1* | 6/2010 | Slessman | | F28F 9/0265 165/67 |
| 2010/0281784 A1* | 11/2010 | Leo | | E04B 1/0023 52/16 |
| 2010/0290197 A1* | 11/2010 | Bergthold | | H05K 7/1497 361/729 |
| 2010/0302744 A1* | 12/2010 | Englert et al. | | 361/730 |
| 2011/0023388 A1* | 2/2011 | Tong | | E04H 5/02 52/173.1 |
| 2011/0053486 A1* | 3/2011 | Holtz et al. | | 454/187 |
| 2011/0240497 A1* | 10/2011 | Dechene | | E04H 5/02 206/320 |
| 2011/0307102 A1* | 12/2011 | Czamara et al. | | 700/277 |
| 2012/0055012 A1* | 3/2012 | Gauthier | | G06F 1/182 29/592.1 |
| 2012/0200206 A1* | 8/2012 | Schmitt et al. | | 312/107 |
| 2012/0255710 A1* | 10/2012 | Maselli et al. | | 165/80.2 |
| 2012/0300372 A1* | 11/2012 | Bergthold et al. | | 361/601 |
| 2013/0019124 A1* | 1/2013 | Grimshaw | | 714/24 |
| 2013/0044426 A1* | 2/2013 | Neumann | | G06F 1/20 361/679.54 |
| 2013/0111937 A1* | 5/2013 | Hendrix | | G06F 1/20 62/127 |
| 2013/0178996 A1* | 7/2013 | Li et al. | | 700/295 |
| 2013/0232888 A1* | 9/2013 | Crosby, Jr. | | 52/79.8 |
| 2013/0293017 A1* | 11/2013 | Englert et al. | | 307/65 |
| 2014/0052429 A1* | 2/2014 | Kelkar | | G06F 3/0625 703/13 |
| 2014/0058958 A1* | 2/2014 | Billings | | 705/307 |
| 2014/0190198 A1* | 7/2014 | Slessman et al. | | 62/314 |
| 2014/0229765 A1* | 8/2014 | Grimshaw | | 714/14 |
| 2014/0238639 A1* | 8/2014 | Ambriz et al. | | 165/57 |
| 2014/0352231 A1* | 12/2014 | Crosby, Jr. | | 52/79.8 |

* cited by examiner

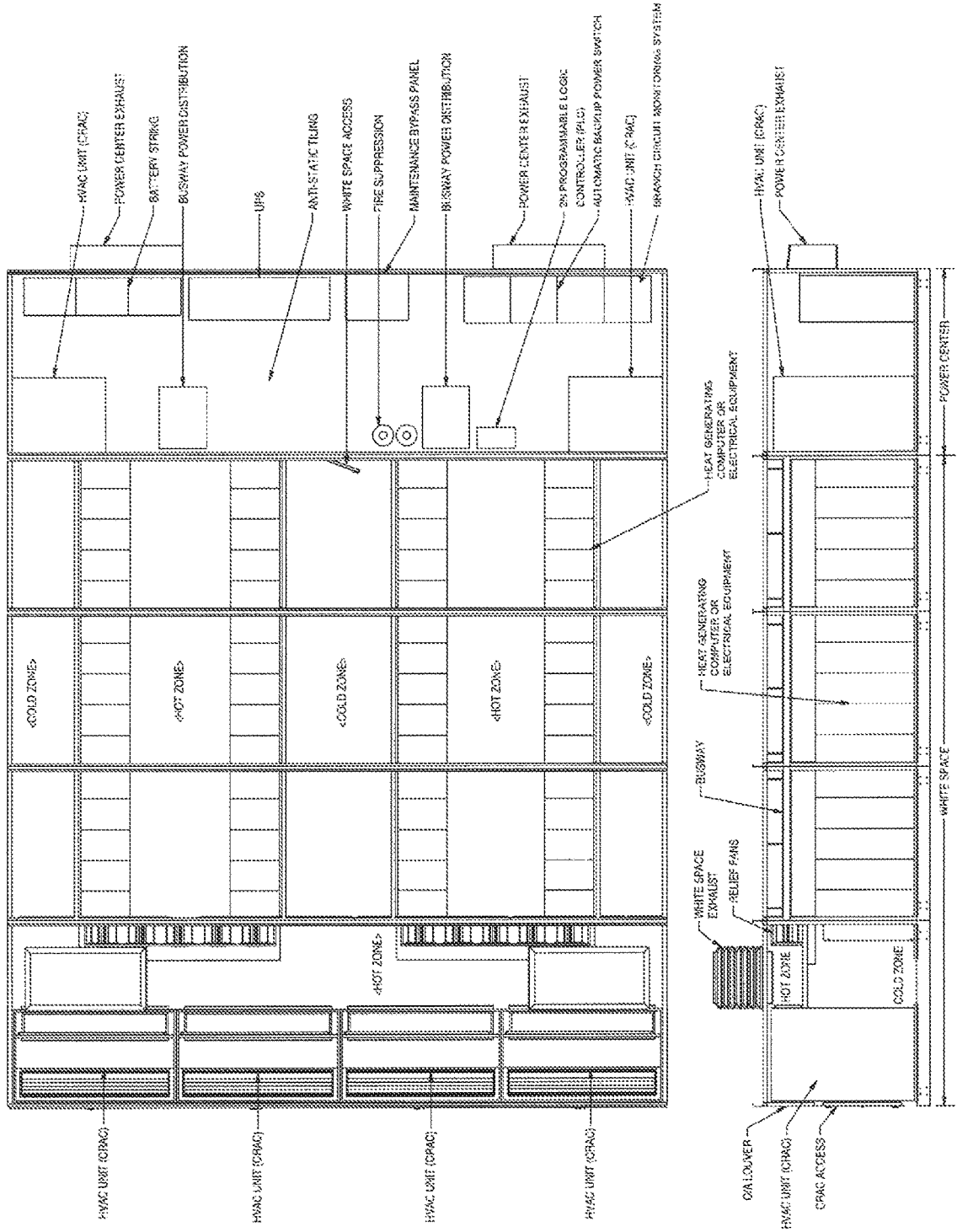
FIG. 1 - MDC PLAN AND PROFILE VIEWS

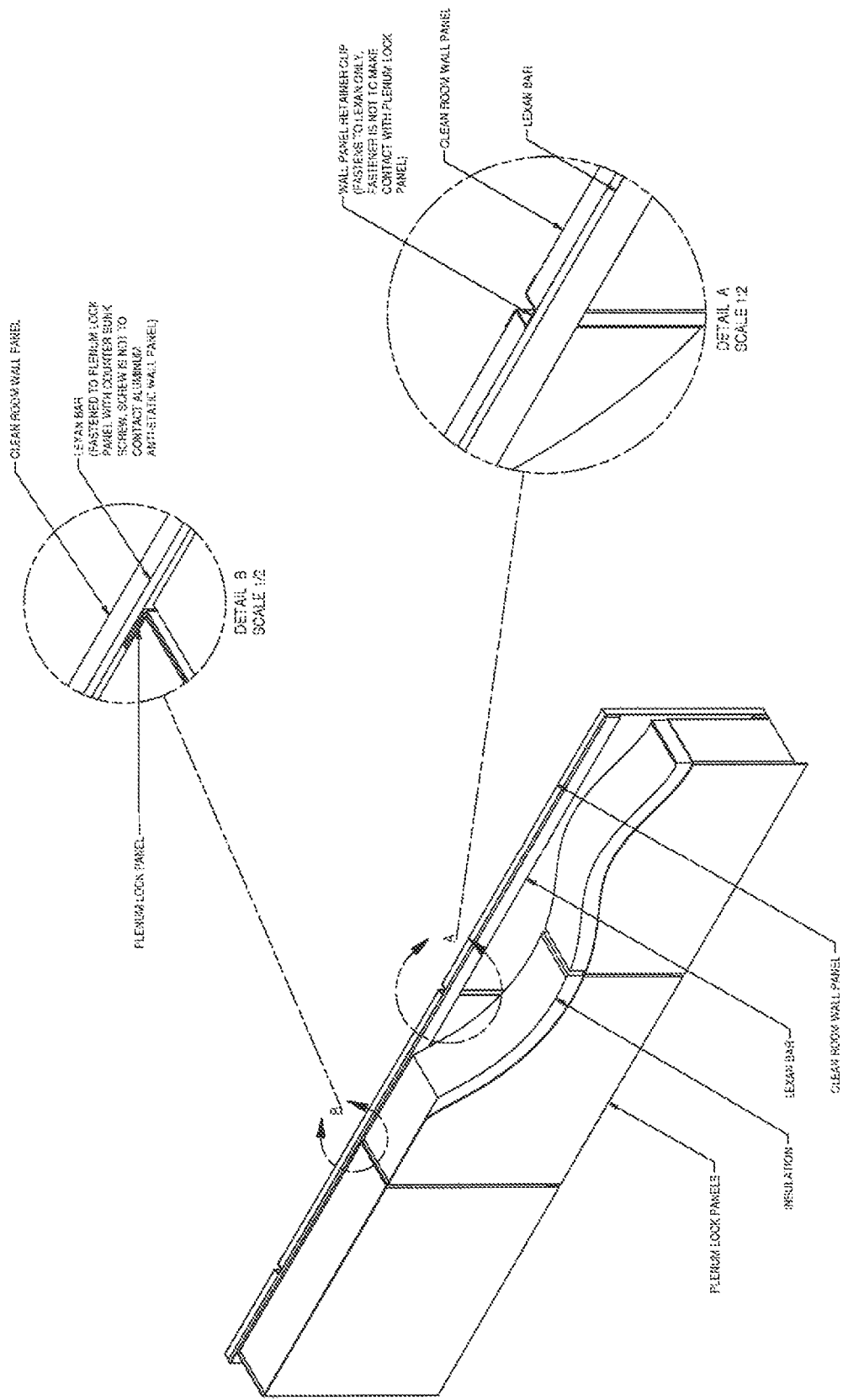
FIG. 2 - MDC THERMAL BREAK WALL CROSS-SECTION

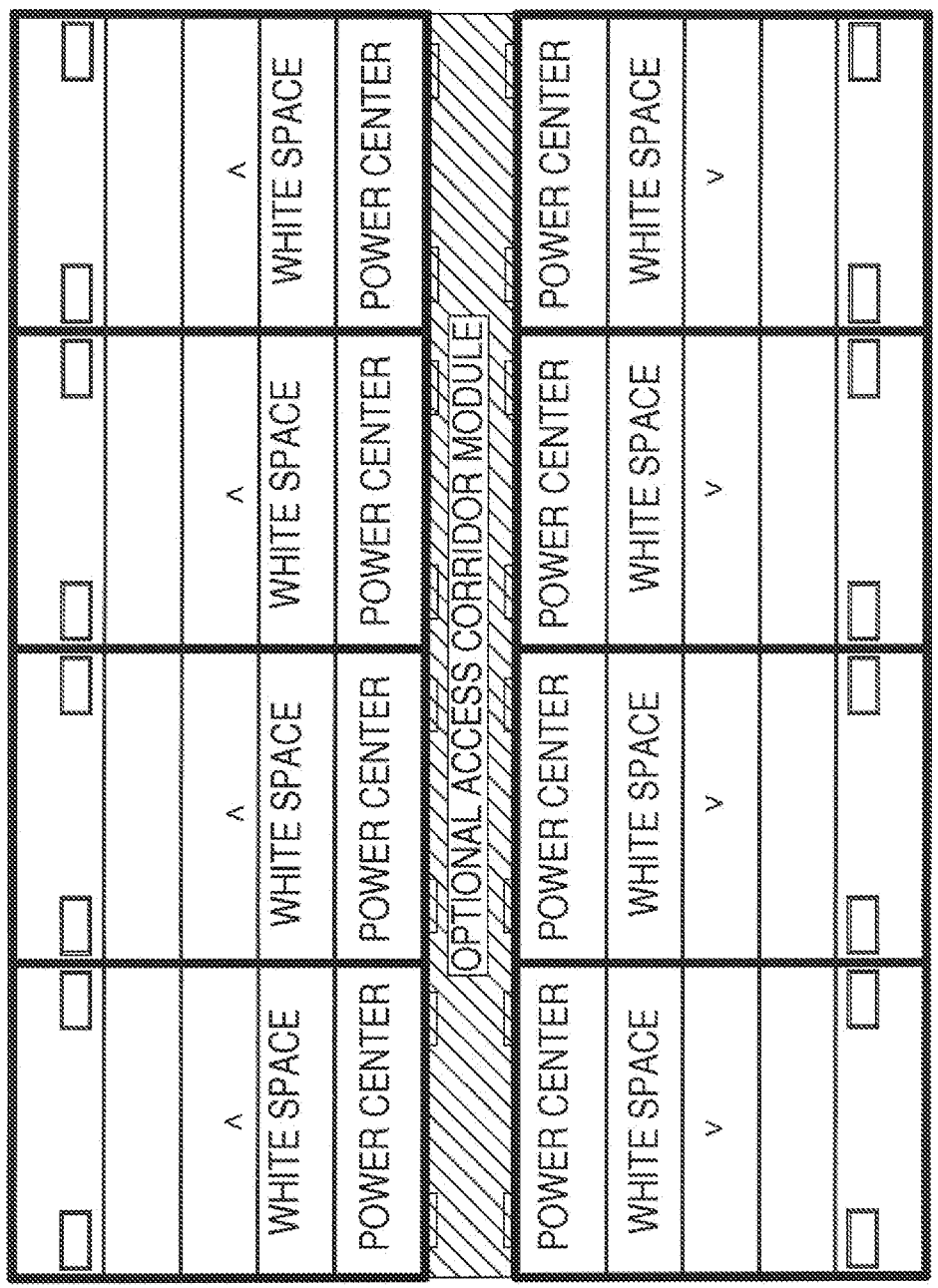
FIG. 3 - MDC MODULE CLUSTER - INTEGRAL POWER CENTER

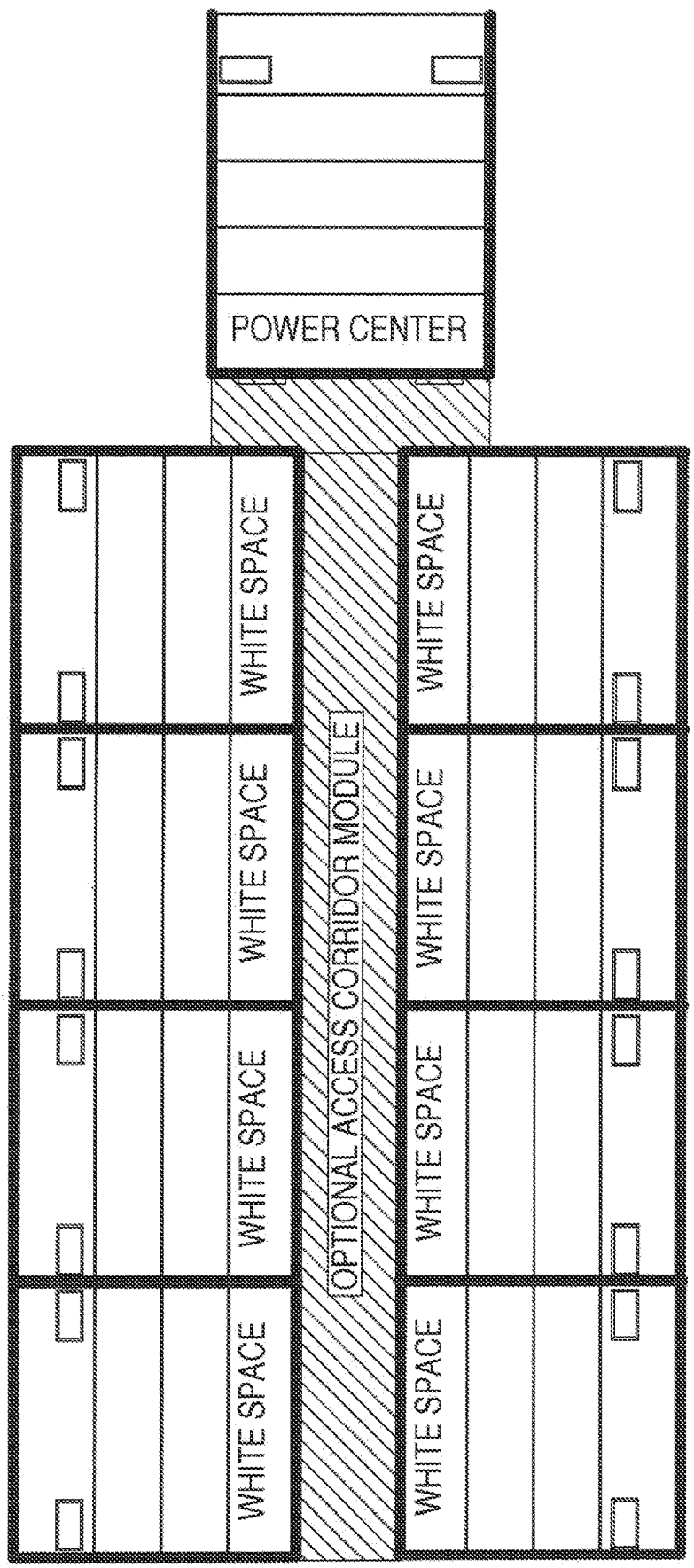
FIG. 4 - MDC MODULE CLUSTER - CENTRALIZED POWER CENTER

MANUFACTURED DATA CENTER

FIELD OF THE DISCLOSURE

The present disclosure relates in general to packaged equipment containing the necessary electrical and mechanical infrastructure for the installation, operation, and cooling of heat-generating equipment within a pre-designed and manufactured environment which equipment includes, but is not limited to, computing and electrical equipment. The disclosure relates in particular to the equipment application as it pertains to units adapted for rapid deployment of computing and electrical equipment.

BACKGROUND

The deployment of equipment such as computer and electrical devices requires appropriate infrastructure to support it. Such infrastructure can include but is not limited to physical "brick-and-mortar" buildings or other protective shells with built-up electrical services, HVAC systems, and communications infrastructure. This infrastructure is typically built in place by contractors. Construction of such built-up infrastructure typically occurs over a timescale of months or years from the time the computer/electrical equipment is ordered until it is put into service.

Computer rooms and other building spaces intended for specialized uses often contain equipment that requires precise control and regulation of environmental conditions such as temperature and humidity in order to ensure proper operation of equipment (such as but not limited to computers) installed in such spaces. Cooling requirements for these types of spaces are typically much greater and more stringent than for most building spaces due to the need to dissipate heat generated by the equipment operating in the equipment rooms. Humidity control requirements are typically stringent as well, since excessive moisture in the air can cause operational and maintenance problems with the equipment such as IT (information technology) equipment. Redundancy of cooling/climate regulation systems is often essential as well, due to the critical nature of the IT equipment that can be installed in these spaces. Accordingly, sufficient redundancy and backup systems are often used in these spaces to ensure continuity of operation of critical equipment.

For large space deployments of computing or electrical equipment, the electrical loads and requirements can be large in comparison to other non-specialized spaces. Accordingly, a robust and specialized electrical infrastructure is required to adequately service the connected equipment and to provide sufficient backup in case of failure of one system. This often includes the use of automatic power transfer switches, generators, UPS battery systems, and two or more sources of electrical power for the equipment, sometimes with entirely separate feeds. Redundancy in HVAC systems is crucial as well to ensure continuity of cooling of critical equipment in the case of failure of an HVAC system component.

In recent years, the single largest application for these types of spaces is the computer data center comprising numerous servers installed in a room or space with the necessary electrical, communications, and HVAC infrastructure to support the equipment. These computer data centers typically reside in brick-and-mortar buildings that have been purpose-built or renovated to accommodate the computing equipment (usually in the form of server racks) and associated electrical equipment. With the dramatic growth in the world's computing capacity requirements in recent years, the growth of data centers around the world has been similarly dramatic.

The main drawback of built-up infrastructure as discussed above is that the time for deployment of the required equipment is very long. In today's rapidly expanding computing world, this can often cause bottlenecks in the ability of a company to roll out additional computing capacity. The extended traditional deployment time also requires long-term forecasting which is not always possible; in the dynamic computing industry, there is often a need for rapid responses to changing market demands. With the extended deployment time due to infrastructure construction, this option is often not available.

The costs associated with building up this type of infrastructure are also considerable, particularly having regard to costs associated with construction of a building or shell, electrical infrastructure, and HVAC systems on site.

In recent years, various companies have designed modular data centers to try to mitigate some of these problems and concerns. The purpose of the modular data center is to provide the required physical protection and electrical and mechanical infrastructure required for the rapid deployment of computing capacity. A typical modular data center has a pre-built casing/enclosure incorporating a cooling system for cooling the equipment contained therein. As well, the electrical infrastructure is typically pre-wired to allow servers to be placed within the modular data center and plugged in.

Modular data centers are typically made in the form of packaged equipment, with most of the assembly being constructed in a factory as opposed to being built up on site. They can be suitable for either indoor or outdoor environments, with most being configured for indoor use. Some modular data centers can be installed on a vacant lot serviced with power, such that a building is not required for the site.

Most modular data centers currently on the market are narrow in scope, and are built for temporary use until a brick-and-mortar installation is ready for use. They are often built from a "server container" standpoint, with insufficient attention being paid to appropriate HVAC and electrical infrastructure. This "server-in-a-box" approach limits the utility and versatility of modular data centers as well as their viability as permanent replacements for brick-and-mortar data centers. Inefficiencies are introduced to the system through the inferior equipment casing construction.

For the foregoing reasons, there is a need for manufactured data centers that can act as a direct drop-in replacement for or alternative to conventional brick-and-mortar buildings while improving upon the construction methods and system configurations found in modular data centers currently on the market.

BRIEF SUMMARY

The present disclosure teaches a manufactured data center (or "MDC") utilizing methods of construction and system design that allow the MDC unit to serve as a drop-in replacement for a traditional brick-and-mortar computer data center, while also providing functional and operational improvements and advantages over modular data centers currently on the market.

The MDC comprises "white space" housing supported equipment such as but not limited to servers and other heat-producing computing equipment, with electrical wiring infrastructure allowing for simple plug-in of electrical equipment, computers racks, and the like. The MDC also includes a power center incorporating electrical equipment and infrastructure necessary for operation of the supported equipment, including an HVAC system which preferably will comprise a self-contained CRAC unit.

As used in this document, the terms "MDC" and "MDC unit" are to be understood as alternative references to embodiments of a manufactured data center in accordance with the present disclosure.

BRIEF DESCRIPTION OF THE DRAWINGS

Exemplary embodiments of MDC units in accordance with the present disclosure are illustrated in the accompanying Figures, as summarized below:

FIG. 1 is a sectioned plan view and profile view of one embodiment of an MDC showing the white space and power center. Critical equipment (e.g., computer racks), supporting electrical infrastructure, module layout, and HVAC system are all illustrated.

FIG. 2 is a cross-section of the typical wall construction utilized by an MDC utilizing an interlocking panel system for rigidity and pressure tolerance. Also shown is the thermal break system and insulation that provides thermal insulating efficiency to keep outside climate influences to a minimum.

FIG. 3 is a plan view showing one possible layout of a multiple-MDC-module installation with the power center integral to each module, complete with optional access corridors.

FIG. 4 is a plan view showing one possible layout of a multiple MDC module installation with a remote Power Center that services all modules, complete with optional access corridors.

DESCRIPTION

The MDC illustrated in FIG. 1 is a self-contained module containing computer server racks or other equipment to be cooled, an HVAC (heating, ventilation, and air conditioning) system and a "power center" containing the supporting electrical service for the critical equipment contained within the MDC and an HVAC system for cooling the electrical equipment contained within. The basic components of the MDC are as follows:

Power Center: contains the necessary supporting electrical equipment and infrastructure required for the operation of the critical equipment contained within the MDC. An HVAC system to cool the electrical equipment contained within the Power Center preferably comprises a purpose-built computer room air conditioning (CRAC) unit for cooling computer rooms and other electrical spaces. The power center also preferably incorporates means for automatically switching to a backup source of power if the primary feed were to fail. The power center is configurable to allow for two utility power feeds with a full generator backup in the case of complete power utility failure, with uninterruptable power source (UPS) units and automatic transfer switches to provide a smooth switchover to one of the backup systems. The power center may be either an integral part of each unit or contained in a separate module as shown in FIGS. 3 and 4.

White Space: contains critical supported equipment such as heat-producing computing equipment, as well as its own HVAC system. The necessary electrical wiring infrastructure for allowing simple plug-in of the servers is also provided. The HVAC system is located within the white space and preferably comprises a purpose-built CRAC unit for cooling computer rooms and other electrical equipment spaces. The electrical infrastructure comprises a series of pre-wired receptacles for plugging in electrical equipment or computer racks. The receptacles can be connected to an electrical busway or directly wired back to an electrical panel.

The MDC is preferably delivered as a scalable piece of packaged equipment listed in accordance with ETL, UL, CSA, and/or other regulatory bodies as may be required by the local jurisdiction. Each unit is configured to minimize installation work and is provided with a single-point electrical connection for each required separate power source, which typically comprises a primary electrical feed with backup generator. The units can be sized to accommodate a variety of different equipment-critical electrical load ratings. As shown in FIGS. 3 and 4, multiple modules can be connected to form a cluster of MDC equipment modules, complete with weatherproof access corridors in multiple configurations to suit the requirements of a given site or application.

The MDC offers significant savings in lead time, capital costs, and initial cash outlay as compared to conventional data centers. The elimination of the brick-and-mortar building as well as the additional time spent installing built-up mechanical, electrical and physical elements as compared to the increased efficiency of installing these elements on an assembly line is responsible for this decreased time and cost. In addition, the MDC is delivered as a piece of packaged equipment, thereby significantly reducing the time and cost of obtaining permits. Additional savings in operational costs are achieved through decreased power consumption and increased thermal efficiencies as explained below.

The equipment casing construction of the MDC is designed to be airtight and well insulated. An interlocking-panel double-wall construction incorporating a thermal break system is utilized as shown in FIG. 2. This interlocking panel construction, which is traditionally found in the construction of pressurized HVAC units, renders the MDC uniquely suited for pressurized applications as compared to existing modular data centers. Prior art units are not intended for pressurized applications and utilize an inferior wall panel construction for operating under negative or positive pressure. The insulation system used in the MDC is preferably selected to give the casing a superior R-value compared to most building envelopes. Thermal inefficiencies found in many buildings due to infiltration and exfiltration are eliminated because of the tight casing construction.

MDC units in accordance with the present disclosure preferably incorporate a special clean-room-grade wall liner and an antistatic clean-room flooring system to prevent the buildup of static electricity charges that could damage or destroy computing equipment when discharged to ground along a path that carries it through the computing equipment. This type of wall and floor system is typically found in clean room applications where sensitive electronics are constructed, stored, or serviced. The wall system forms a part of the thermal break system mentioned in the paragraph above.

MDCs in accordance with the present disclosure can be adapted to use a variety of cooling systems including but not limited to chilled water, DX (direct expansion) refrigeration, direct and indirect evaporative cooling, and are readily adaptable to a variety of novel and unique cooling systems and energy recovery schemes. The HVAC systems and related controls for the MDCs are designed to provide reliable data center climate control while significantly reducing the electrical energy consumption of the equipment room or data center's HVAC system.

The MDC's HVAC mechanical system allows for sufficient redundancy to accommodate several different mechanical component failures. "N+1 redundancy" in the cooling system allows the HVAC cooling system to continue to operate at 100% design capacity notwithstanding the failure of any one single component. The HVAC fan system is designed for full "2N redundancy" while maintaining 100% design airflow. The HVAC system preferably comprises two or more conventional purpose-built computer room air conditioning (CRAC) units, with each CRAC unit incorporating standalone programmable logic controllers (PLCs) that can interface with the MDC control system or operate independently.

The heat-generating computer or electrical equipment contained within the MDC is arranged to allow for unidirectional airflow with segregated hot and cold zones within the unit. This greatly increases the cooling efficiency of the HVAC system by preventing rejected heat from being recirculated through the cooled equipment. The design of the MDC white space specifically accommodates this hot/cold zone arrangement.

The MDC is controlled by a dedicated, onboard PLC, which controls all aspects of MDC operation including monitoring internal temperatures, modulating fan speed, and operation of the cooling systems. The control system incorporates a 2N system redundancy to allow for a full system backup to the primary PLC and sensors, with automatic switchover in the case of primary PLC failure or sensor failure. The control system allows for the MDC to provide precise temperature and humidity control in the white space and power center.

The MDC's PLC controller can be configured either to run as a stand-alone controller or to communicate with an outside building management system, or it can be provided with its own built-in web interface to facilitate remote monitoring over the internet from anywhere in the world.

Full power efficiency performance and PUE (Power Utilization Efficiency) measurement in the MDC can be monitored by a branch circuit monitoring system available as part of the power center. The branch circuit monitoring can then be output to the MDC control system and monitored remotely through a built-in control system or by an external monitoring system.

Variants of the disclosed MDC can be adapted in accordance with one or more options as listed below with respect to airflow configuration, air conditioning method, control type, and capacity:

Location: MDCs are fully configurable for either indoor or outdoor operation.

Air conditioning method: As mentioned above, multiple cooling options exist. In addition, for low density systems in cold climates, auxiliary heating systems are available to prevent excessively low temperatures within the MDC white space and power center.

Control method: MDCs are configurable to operate as stand-alone pieces of equipment or can interact with an external building management and monitoring system either provided by others or provided with the MDC. Different methods of control are available as dictated by client requirements.

Capacity: MDCs can be provided in a wide variety of different sizes, dependent upon the type and amount of critical load (e.g., cooled equipment) to be placed in each module. Regardless of the MDC capacity used, systems can be scaled to deployments of any size through the use of multiple-MDC modules.

It will be readily appreciated by those skilled in the art that various modifications to embodiments in accordance with the present disclosure may be devised without departing from the scope and teaching of the present teachings, including modifications which may use equivalent structures, systems, or materials hereafter conceived or developed. It is to be especially understood that the scope of the claims appended hereto should not be limited by any particular embodiments described and illustrated herein, but should be given the broadest interpretation consistent with the description as a whole. It is also to be understood that the substitution of a variant of a claimed element or feature, without any substantial resultant change in functionality, will not constitute a departure from the scope of the disclosure.

In this patent document, any form of the word "comprise" is intended to be understood in its non-limiting sense to mean that any item following such word is included, but items not specifically mentioned are not excluded. A reference to an element by the indefinite article "a" does not exclude the possibility that more than one such element is present, unless the context clearly requires that there be one and only one such element. Any use of any form of any term describing an interaction between elements is not meant to limit the interaction to direct interaction between the elements in question, but may also extend to indirect interaction between the elements such as through secondary or intermediary structure.

Wherever used in this document, terms such as "typical" and "typically" are to be interpreted in the sense of representative or common usage or practice, and are not to be understood as implying invariability or essentiality.

What is claimed is:

1. A self-contained manufactured data center (MDC) comprising a plurality of white space modules:
    (a) one or more of the white space modules for receiving heat-producing equipment;
    (b) a power centre incorporating selected electrical equipment and infrastructure integral to each of the respective white space modules with optional corridor access for supporting the heat-producing equipment installed in the one or more white space modules; and
    (c) a heating, ventilation, and air conditioning (HVAC) system for cooling the heat producing equipment installed in the one or more white space modules, wherein the foregoing are all contained within the MDC and disposed laterally so as to minimize the vertical profile of the MDC.

2. An MDC as in claim 1, further comprising automatic switching means for automatically switching to a backup power source of power upon failure of a primary electrical feed to the power centre.

3. An MDC as in claim 1 wherein at least one of the one or more white space modules incorporates busway power to facilitate plug-in connection of heat-producing equipment.

4. An MDC as in claim 1 wherein the HVAC system comprises a self-contained computer room air conditioning (CRAC) unit.

5. An MDC as in claim 1 wherein the MDC is airtight and insulated.

6. An MDC as in claim 5 wherein the MDC comprises a system of interlocking wall panels incorporating a thermal break system.

7. An MDC as in claim 5 wherein the MDC comprises a clean-room-grade wall liner and an antistatic clean-room flooring system.

8. An MDC as in claim 1 wherein the HVAC system incorporates a cooling system selected from the group consisting of direct expansion (DX) refrigeration, direct evaporative cooling, and indirect evaporative cooling.

9. An MDC as in claim 1 wherein the MDC is configured to accommodate heat-generating equipment in at least one of the one or more white space modules so as to allow for unidirectional airflow with segregated hot and cold zones within at least one of the one or more the white space modules.

10. An MDC as in claim 1, further comprising a control system incorporating a programmable logic controller (PLC) adapted to control one or more aspects of MDC operation selected from the group consisting of monitoring internal temperatures, modulating fan speed, and operation of cooling systems.

11. An MDC as in claim 10 wherein the control system incorporates a 2N system redundancy to allow for a full system backup to the PLC.

12. An MDC as in claim 10 wherein the PLC is configured to communicate with an outside building management system.

13. An MDC as in claim 10 wherein the PLC comprises a built-in web interface to facilitate remote monitoring over the internet.

14. An MDC as in claim 1 wherein the power center further comprises a branch circuit monitoring system adapted for measurement of full power efficiency performance and power utilization efficiency in the MDC.

\* \* \* \* \*